United States Patent [19]

Kohnen

[11] Patent Number: 5,189,629
[45] Date of Patent: Feb. 23, 1993

[54] METHOD OF LOGIC GATE REDUCTION IN A LOGIC GATE ARRAY

[75] Inventor: Kirk K. Kohnen, Fullerton, Calif.

[73] Assignee: Hughes Aircraft Company, Los Angeles, Calif.

[21] Appl. No.: 533,985

[22] Filed: Jun. 6, 1990

[51] Int. Cl.$^5$ .............................................. G06F 15/60
[52] U.S. Cl. .................................... 364/490; 364/489; 364/488
[58] Field of Search ................ 364/488, 489, 490, 491

[56] References Cited

U.S. PATENT DOCUMENTS

| | | | |
|---|---|---|---|
| 3,778,815 | 12/1973 | Wright | 340/365 |
| 4,600,995 | 7/1986 | Kinoshita | 364/491 |
| 4,792,909 | 12/1988 | Serlet | 364/491 |
| 4,823,278 | 4/1989 | Kikuchi et al. | 364/491 |
| 4,960,724 | 10/1990 | Watanabe et al. | 364/490 |

*Primary Examiner*—Vincent N. Trans
*Attorney, Agent, or Firm*—Wanda K. Denson-Low

[57] ABSTRACT

A method of gate reduction in a gate width limited logic array. Common sub-groups of inputs associated with an array output are collected. Logical functions are then reimplemented, using the common subgroups implemented as single gates resulting in an implementation of the logical functions that uses few active devices. The method uses a constraint typically placed on gate array logic that gates wider than four inputs cannot be used. The method is applicable to combinatorial digital logic devices only. The method of the present invention is applicable to large scale integration (LSI) and very large scale integration (VLSI) integrated circuit devices.

10 Claims, 2 Drawing Sheets

METHOD OF LOGIC GATE REDUCTION IN A LOGIC GATE ARRAY

BACKGROUND

The present invention relates to logic circuit design technology, and more particularly, to a method for optimizing the number of logic gates in a logic gate array.

An established method of logic circuit design is to manually design the desired logic circuit. Given desired input to output logic relationships or functions, logic schematics are designed. These relationships expressed as boolean algebraic functions and the resulting logic circuits are typically simplified using conventional algebraic simplification methods, Karnaugh maps, truth tables and the like.

Computers are also currently used to design an integrated circuit device corresponding to a finalized logic function. In this process, the computer executes a program to transform a high level description of a digital logic circuit into an integrated circuit implementation of that design. The synthesis techniques used in the computer programs typically implement a set of logic functions treating common terms in the relationships independently. This causes redundant implementation of logic functions having common terms and results in redundant logic gates in the final circuit. These computer techniques do not attempt to find and group common inputs coupled to basic or first level logic gates such as AND or OR gates. Logic circuits designed by conventional computer programs may also use wide logic gates (gates having more than four inputs). The use of wide gates can degrade signal strength and switching speed of a gate array. Such an approach requires increased repowering of the logic gate array. For these and similar reasons, logic circuits designed by conventional computer programs are not optimally fast or efficient.

Accordingly, it is an objective of the present invention to provide an improved method of logic gate reduction in a logic gate array. Another objective of the present invention is to simplify the design of digital circuits. A further objective of the present invention is to provide a method for designing logic gate arrays having increased operating speed, that use less power, and that are produced at reduced cost.

SUMMARY OF THE INVENTION

In accordance with these and other objectives of the present invention, there is provided a method of designing logic circuit gate arrays (also referred to herein as "gate arrays"). The invented method synthesizes a logic gate (also referred to herein as "gate") implementation of a set of boolean functions that uses fewer gates than current techniques. Using the constraint that gates wider than a predetermined number cannot be used because of physical limitations such as switching speed and repowering, the method of the present invention collects the inputs to a gate array into sets of common inputs. A number of inputs in a set is equal to or less than the predetermined maximum number of inputs allowed to a gate. A typical maximum number of inputs is four. The method then implements the gate array logic function using the sets of common inputs resulting in an implementation for the logic function that uses fewer gates.

A logic gate array which includes at least one wide logic gate and having a desired input to output logic functions is given. The first step in the method is to group the logic gate array inputs into a first input set. The number of inputs in the set is a selected maximum number of inputs allowed to a gate and is comprised of the most frequently occurring inputs common to the gates. The first set of inputs is then implemented using a single logic gate which has the same logic function AND, OR etc.) as the logic gates to which the inputs were originally connected. The corresponding inputs in the logic functions are then replaced with the input set.

The remaining inputs in the logic functions are then grouped into a second input set comprised of the next most repetitive group of inputs to the gate array. The second set of inputs is implemented with a single logic gate, again having the same logic function as the logic gate to which the inputs were originally connected and the corresponding inputs in the logic functions are replaced with the input set. When there are no more input sets having a number of inputs equal to the maximum input sets are formed having a number of inputs equal to the maximum minus one. This process is repeated until the number of inputs in an input set is two.

Finally, each set of inputs to a gate of the gate array is replaced with the output of the single gate that implements that input set. If the resulting gate array still includes logic gates having more than the maximum allowable number of inputs such as may happen if a gate in the array has more than four input sets as its inputs, the steps of the method are repeated using the single gate outputs of the implemented array in place of the original group of inputs.

BRIEF DESCRIPTION OF THE DRAWINGS

The various features and objectives of the present invention may be more readily understood with reference to the following detailed description taken in conjunction with the accompanying drawings, wherein like reference numerals designate like structural elements, and in which.

DETAILED DESCRIPTION

Figure 1:
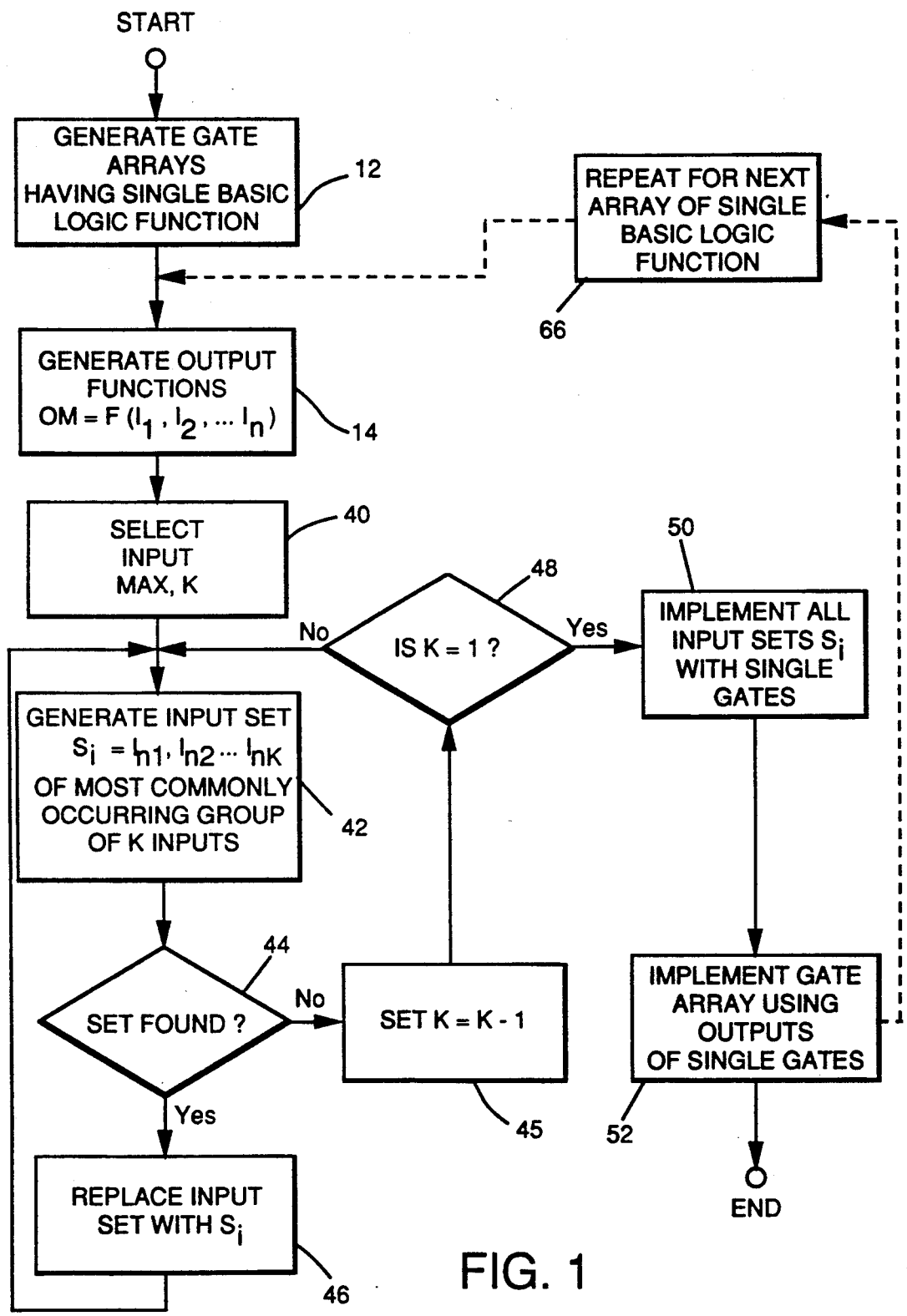
FIG. 1 is a flow chart illustrating the sequential steps of the method of the present invention.

Referring now to FIG. 1, there is shown a flow chart 10 illustrating the steps of the invented method, each step being represented by a block of the flow chart 10. In step 12, the gates in a gate array are first separated into gate arrays in which all of the gates have the same basic logic function such as AND, and OR, etc. The next step 14 is to generate output relationships or functions for the given set of input to output logic functions. These output functions represent the group of all inputs to the gate array associated with a single output and may be represented as a set of output functions of the form: $OUT_M = f(I_1, I_2, \ldots I_n)$, where M is the index of an output O and n is the index of an input I.

Figure 2:
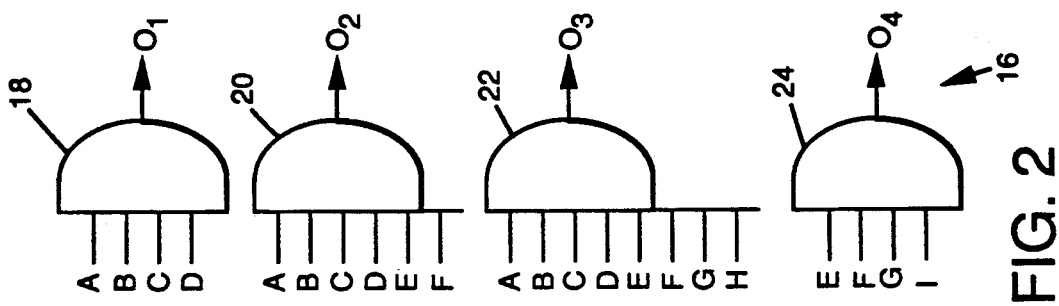
FIG. 2 is a logic diagram of a typical logic gate array used to illustrate an example of the method of the present invention.

For example, referring to FIG. 2 a typical AND gate array 16 is illustrated, the gate array 16 includes four AND gates, 18, 20, 22, and 24 variously connected to receive inputs a, b, c, d, e, f, g, h, and i which are logically combined by the AND gates 18, 20, 22, 24 to produce outputs O1, O2, O3, and O4. The input to output functions are:

$O_1 = f(I_a, I_b, I_c, I_d)$, $O_2 = f(I_a, I_b, I_c, I_d, I_e, I_f)$, $O_3 = f(I_a, I_b, I_c, I_d, I_e, I_f, I_g, I_h)$, and $O_3 = f(I_e, I_f, I_g, I_i)$.

Figure 3:
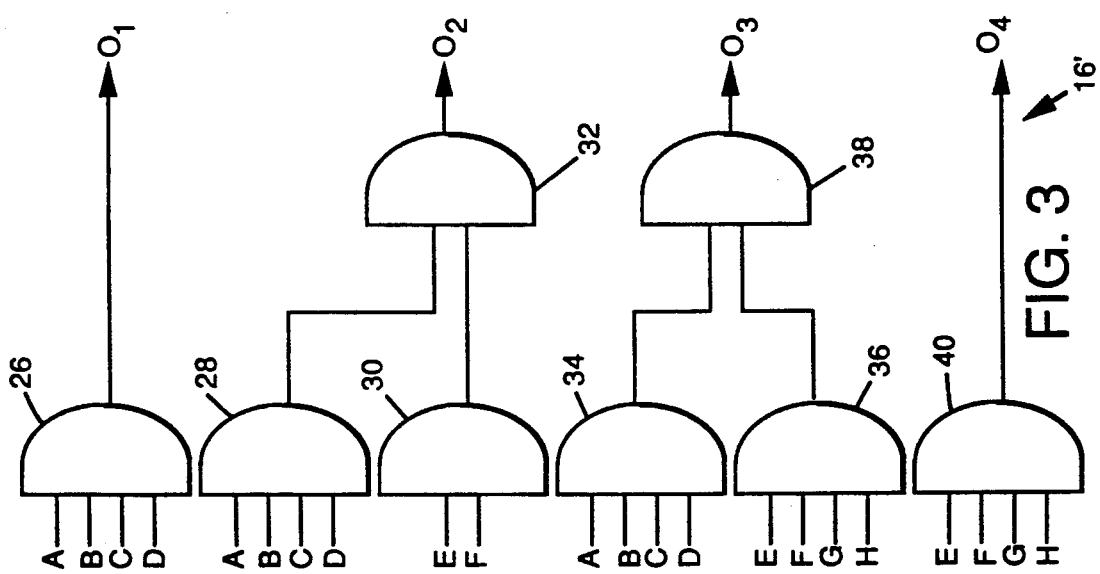
FIG. 3 is a logic diagram of the logic gate array of FIG. 2 implemented using a conventional computer program.

Using a conventional computer implementation program in which all inputs are treated independently, the gate array 16 of FIG. 2 would be implemented, using four input width gates, as the gate array 16' of FIG. 3. The array 16' is seen to comprise eight four input AND gates 26, 28, 30, 32, 34, 36, 38 and 40.

The maximum number K of inputs applied as inputs to any gate is placed at a predetermined maximum in step 40. This maximum is a function of the physical parameters of the gates used in the gate array 16. Typical physical parameters that affect this maximum are the switching speed of the gate as the number of gate inputs are increased and the number of times the gate array must be repowered as the number of input to a gate is increased. A typical value of the number of inputs is four.

The next step 42 in the invented method is to form a first input set. The first input set includes the most commonly occurring set of the maximum number of inputs allowed for a gate, four in the present instance. That is, the first input set comprises the four inputs that occur most frequently as a group of inputs to the individual gates of the array. This input set can be represented as: $S_i = I_{n1}, I_{n2}, I_{n3}, I_{n4}$, where 1, 2, 3, and 4 are the indicia of most commonly occurring group of four inputs to the gates of the array. For the array 16 the most frequently occurring group of four inputs produces the first output set: $S_1 = I_a, I_b, I_c, I_d$. The method next tests for the existence of such a set in decision block 44. If such a four input group is found, the next step 46 of the method is to replace all occurrences of the four input group in the output functions with the input set $S_i$. Applying this step 46 to the groups of inputs of the array 16 yields:

$O_1 = f(S_1)$, $O_2 = f(S_1, I_e, I_f)$, $O_3 = f(S_1, I_e, I_f, I_g, I_h)$, and $O_4 = f(I_e, I_f, I_g, I_i)$.

The method now returns to step 42 and a next input set is generated comprised of the next most commonly occurring group of four inputs. If no group of four inputs is found, as determined in decision block 44, the size of an input set is reduced by one in step 45. The number of inputs K is tested in step 48. If K>1, the method returns to step 42 and the most commonly occurring group of inputs which includes a number of inputs equal to the maximum number minus one is formed. As each input set is generated, the corresponding group of inputs in the output functions are replaced with the input set as shown in method step 46. These steps are repeated until the number of inputs in an input set is, as determined in the K=K−1 test block 48, equal to 1. At this point all input sets of two inputs have replaced the corresponding group of inputs in the output functions.

Applying these steps to the array 16, successively produces output functions:

$S_2 = I_e, I_f, I_g, I_h$, $S_3 = f(I_e, I_f, I_g, I_i)$ $O_1 = f(S_1)$, $O_2 = f(S_1, I_e, I_f)$, $O_3 = f(S_1, S_2)$, $O_4 = f(S_3)$, $S_3 = I_e, I_f, I_g, I_i$ $O_1 = f(S_1)$, $O_2 = f(S_1, I_e, I_f)$, $O_3 = f(S_1, S_2)$, $O_4 = f(S_3)$, $S_4 = I_e, I_f$ $O_1 = f(S_1)$, $O_2 = f(S_1, S_4)$, $O_3 = f(S_1, S_2)$, $O_4 = f(S_3)$.

It will be observed that the only inputs remaining in the output functions are single inputs. The next step 50 in the method is to implement each input set $S_i$ with a single basic logic gate (a gate that performs a basic function such as AND, OR, etc.) that has the input set as its inputs. That is, each occurrence of an input set $S_i$ represents a single basic logic gate. It will further be observed that the output of these single simple logic gates are the logical equivalent of the input set to the corresponding gate of the original array. Finally, in step 52, the group of inputs to a gate that have been grouped into an input set are replaced with a single input to that gate and that input is connected to the output of the single basic logic gate that has the corresponding set as its inputs.

Figure 4:
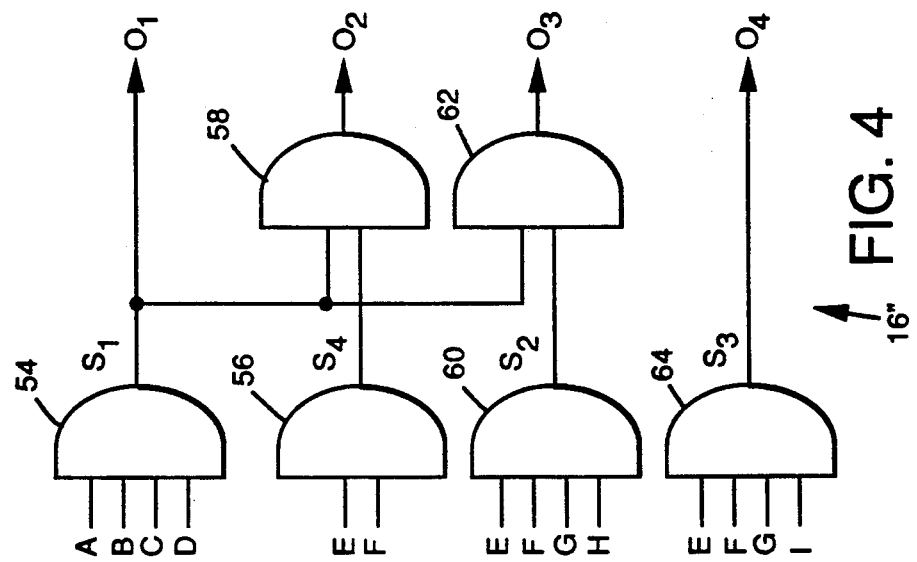
FIG. 4 is a logic diagram of an implementation of logic gate array using the method of the present invention.

Applying these steps to the array 16 produces reduced gate count array 16'' of FIG. 4. The array 16'' comprised of gates 54, 56, 58, 60, 62, and 64 and represents a 25% reduction in the gate count of the original gate array 16 implemented using four input gates. If the original gate array, such as gate array 16, includes gates of more than one basic logic function, the method, in step 66, repeats steps 12 through 52 for each basic logic function.

In very large gate arrays, it is possible that a gate of the original gate array will have more than four single gate outputs as its inputs after the steps of the method have been performed. In this event, the method is simply repeated using the single gate outputs as the gate array inputs. While the gate array 16 used to exemplify the steps of the method, it will be appreciated that contemporary logic circuits incorporate very large gate arrays which may include hundreds or even thousands of gates. In these cases, the method steps of the present invention, which manipulate the inputs to the gate array as a group rather than individually as in prior art methods, results in a substantial reduction in the gate count, wherein reductions on the order of 60 to 70% are possible.

Thus there has been disclosed a new and improved method for reducing the gate count of gate width limited logic gate arrays. It is to be understood that the above-described method is merely illustrative of some of the many specific methods which represent applications of the principles of the present invention. Clearly, numerous and other steps can be readily devised by those skilled in the art without departing from the scope of the invention.

What is claimed is:

1. A computer implemented processing method for reducing, the gate count in a gate array formed of gates having the same basic logic function, the gate array including at least one wide gate, and for connecting gate array inputs and outputs to perform predetermined output logic functions, said method comprising the steps of:

(a) grouping the gate array inputs into output function groups, there being one output function group for each output of the gate array and each output function group including all of the gate array inputs associated with that gate array output;
   (b) setting a gate width limit;
   (c) starting with a number of inputs equal to the gate width limit, generating an input set that includes the most commonly occurring combination of gate array inputs in the output function groups;
   (d) replacing the combination of gate array inputs in the output functions with the input set;
   (e) repeating steps (c) and (d) until all combinations of gate array inputs in the output functions are replaced with an input set;
   (f) implementing each input set with a single gate of the same basic logic function as the gates of the gate array and having the input set as its inputs; and
   (g) replacing each input set connected to a gate of the gate array with a single input connected to the output of that single gate having the input set as its inputs.

2. The method of claim 1 wherein, if upon completing steps(a) through (g), there are gates in the resulting gate array having a number of inputs and single gate outputs as their inputs that are greater than the gate width limit, the method further comprises the step of repeating steps (a) through (g) using the single gate outputs and gate array inputs connected to gates of the array as the gate array inputs.

3. The method of claim 1 wherein, if the gate array further includes gates of more than one basic logic function, the method further comprises the step of first separating the gates of the gate array into a plurality of gate arrays in each of which all of the gates have the same basic logic function, and performing steps (a) through (g) for each of the plurality of gate arrays.

4. The method of claim 3 wherein the basic logic gates comprise an OR or AND logic function.

5. The method of claim 4 wherein the step (a) includes setting the gate width limit equal to four.

6. The method of claim 5 wherein steps (c), (d), and (e) include successively forming the most commonly occurring combinations of four, three, and two inputs.

7. The method of claim 3 wherein, upon completing steps (a) through (g), if there are gates in the resulting gate array having a number of inputs and single gate outputs as its inputs that are greater than the gate width limit, the method further comprises the step of repeating steps (a) through (g) using the single gate outputs and gate array inputs connected to gates of the array as the gate array inputs.

8. The method of claim 7 wherein the basic logic gates comprise an OR or AND logic function.

9. The method of claim 8 wherein the step (a) includes setting the gate width limit equal to four.

10. The method of claim 9 wherein steps (c), (d), and (e) include successively forming the most commonly occurring combinations of four, three, and two inputs.

* * * * *